US009141145B2

(12) United States Patent
White et al.

(10) Patent No.: US 9,141,145 B2
(45) Date of Patent: Sep. 22, 2015

(54) SECURITY APPARATUS WITH A MODULAR SYSTEM FOR ACCESSORIES

(71) Applicant: ACCO Brands Corporation, Lake Zurich, IL (US)

(72) Inventors: Ryan White, Salem, MA (US); A. John Venida, San Francisco, CA (US); Jonathan Stacey, Vancouver (CA); Wilson Shu Chiu Tse, Burnaby (CA)

(73) Assignee: ACCO Brands Corporation, Lake Zurich, IL (US)

( * ) Notice: Subject to any disclaimer, the term of this patent is extended or adjusted under 35 U.S.C. 154(b) by 94 days.

(21) Appl. No.: 14/159,107

(22) Filed: Jan. 20, 2014

(65) Prior Publication Data
US 2014/0204529 A1 Jul. 24, 2014

Related U.S. Application Data

(60) Provisional application No. 61/755,908, filed on Jan. 23, 2013.

(51) Int. Cl.
G06F 1/16 (2006.01)
H05K 5/00 (2006.01)
H05K 5/02 (2006.01)

(52) U.S. Cl.
CPC ............ *G06F 1/1675* (2013.01); *H05K 5/0004* (2013.01); *H05K 5/0208* (2013.01); *H05K 5/0221* (2013.01)

(58) Field of Classification Search
CPC combination set(s) only.
See application file for complete search history.

(56) References Cited

U.S. PATENT DOCUMENTS

| 6,212,921 | B1 * | 4/2001 | Knighton | 70/58 |
| 6,427,499 | B1 * | 8/2002 | Derman | 70/58 |
| 6,570,756 | B2 * | 5/2003 | Alfonso et al. | 361/679.57 |
| 7,724,520 | B2 * | 5/2010 | Allen | 361/679.57 |
| 7,997,106 | B2 | 8/2011 | Mahaffey et al. | |
| 8,276,872 | B2 * | 10/2012 | Lampman et al. | 248/551 |
| 8,638,557 | B2 * | 1/2014 | Tsai | 361/679.56 |
| 8,775,710 | B1 * | 7/2014 | Miller et al. | 710/303 |
| 8,885,337 | B2 * | 11/2014 | Schanz et al. | 361/679.58 |
| 2006/0250767 | A1 * | 11/2006 | Brophy et al. | 361/686 |
| 2008/0198543 | A1 * | 8/2008 | Lord | 361/683 |
| 2009/0294617 | A1 * | 12/2009 | Stacey et al. | 248/316.1 |
| 2012/0317779 | A1 | 12/2012 | Myers et al. | |
| 2012/0318711 | A1 | 12/2012 | Stacey et al. | |
| 2014/0328020 | A1 * | 11/2014 | Galant | 361/679.56 |

* cited by examiner

Primary Examiner — Lisa Lea Edmonds
(74) Attorney, Agent, or Firm — Michael Best & Friedrich LLP

(57) ABSTRACT

A security apparatus for securing a portable device includes a housing having a first housing portion configured to partially surround a first portion of the portable device, and a second housing portion configured to partially surround a second portion of the portable device. The second housing portion is selectively secured to the first housing portion when the housing is engaged with the portable device. The security apparatus also includes an attachment device extending from the housing. The attachment device is configured to engage a locking head. The security apparatus further includes a modular accessory coupled to the housing. The modular accessory is connected to the housing when the first and second housing portions are secured together to surround the portable device. The modular accessory is only removable from the housing when the first and second housing portions are disconnected from the portable electronic device.

20 Claims, 14 Drawing Sheets

SECURITY APPARATUS WITH A MODULAR SYSTEM FOR ACCESSORIES

CROSS-REFERENCE TO RELATED APPLICATIONS

This application claims priority to U.S. Provisional Patent Application No. 61/755,908, filed Jan. 23, 2013, the entire contents of which are incorporated by reference herein.

BACKGROUND

Embodiments of the present invention relate to devices for protecting and inhibiting the theft of relatively small but expensive pieces of equipment, such as tablets, laptops, iPads™, iPhones™, similar mobile computing devices, or electronic devices without a security slot (e.g., a Kensington™ security slot).

As thinner and slimmer portable electronic devices (e.g., tablet devices) are developed, the form factors of the thinner devices do not allow typical physical security devices (e.g., locks) designed for a larger form factor to be used. The thinner form factors and bodies of the thinner computers do not provide opportunities for attachment points that are typically required for use in conjunction with security cable lock products without the use of permanent adhesive based attachment methodologies. However, permanent adhesive based attachment methodologies can require more maintenance, be less secure, less portable, and less stylish than cable lock methodologies.

Furthermore, tablet devices and other portable devices consumers are increasingly being used in commercial settings and applications (e.g., restaurants, tradeshows, retail, etc.) as point of sale (POS) terminals and interactive displays and kiosks with which consumers may interact. As these relatively fragile and expensive devices are in public use and may be accessed by a number of different users, the tablet devices are typically enclosed in a protective and/or secure enclosure to ensure the device is protected from damage as well as theft.

SUMMARY

Embodiments of the present invention utilize a modular system of accessory components that enable commercial customers to configure a product that best suits their specific application while continuing to provide a safe and protective enclosure for their portable electronic device. Additionally, the modular components and accessories are also secured to the enclosure in order to prevent tampering with key aspects while the system is in use.

Embodiments of the present invention provide a number of advantages including allowing a wide range of applications for a single product through the modular accessories that may be mixed, matched, exchanged, and selected based on the specific needs of the customer. Accordingly, a single core protective and secure enclosure product can be customized with smaller accessory components and fill a large number of needs for any customer.

In one embodiment, the invention provides a security apparatus for securing a portable device. The security apparatus includes a housing having a first housing portion configured to partially surround a first portion of the portable device, and a second housing portion configured to partially surround a second portion of the portable device. The second housing portion is selectively secured to the first housing portion when the housing is engaged with the portable device. The security apparatus also includes an attachment device extending from the housing. The attachment device is configured to engage a locking head. The security apparatus further includes a modular accessory coupled to the housing. The modular accessory is connected to the housing when the first and second housing portions are secured together to surround the portable device. The modular accessory is only removable from the housing when the first and second housing portions are disconnected from the portable electronic device.

In another embodiment, the invention provides a security apparatus for securing a portable device. The security apparatus includes a housing having a first housing portion configured to partially surround a first portion of the portable device, and a second housing portion configured to partially surround a second portion of the portable device. The second housing portion is coupled to the first housing portion when the housing is engaged with the portable device. The security apparatus also includes a security bar defining a clearance aperture. The security bar engages the first housing portion and the second housing portion to secure the first and second housing portions together. The security apparatus further includes an attachment device extending from the housing through the clearance aperture of the security bar. The attachment device is configured to engage a locking head to inhibit removal of the security bar from the first and second housing portions. The security apparatus further includes a modular accessory coupled to the housing.

In yet another embodiment, the invention provides a security system including a portable device and a security apparatus. The security apparatus includes a housing having a first housing portion partially surrounding a first portion of the portable device, and a second housing portion partially surrounding a second portion of the portable device. The second housing portion is coupled to the first housing portion so that the housing engages the portable device. The security apparatus also includes a security bar defining a clearance aperture. The security bar engages the first housing portion and the second housing portion to secure the first and second housing portions together. The security apparatus further includes an attachment device extending from the housing through the clearance aperture of the security bar, and a modular accessory coupled to the housing. The modular accessory cannot be removed from the housing without disengaging the security bar from the first and second housing portions. The security system also includes a locking head secured to the attachment device to inhibit removal of the security bar from the first and second housing portions. The locking head is configured to be secured to an immovable object.

Other aspects of the invention will become apparent by consideration of the detailed description and accompanying drawings.

DETAILED DESCRIPTION

Figure 1:
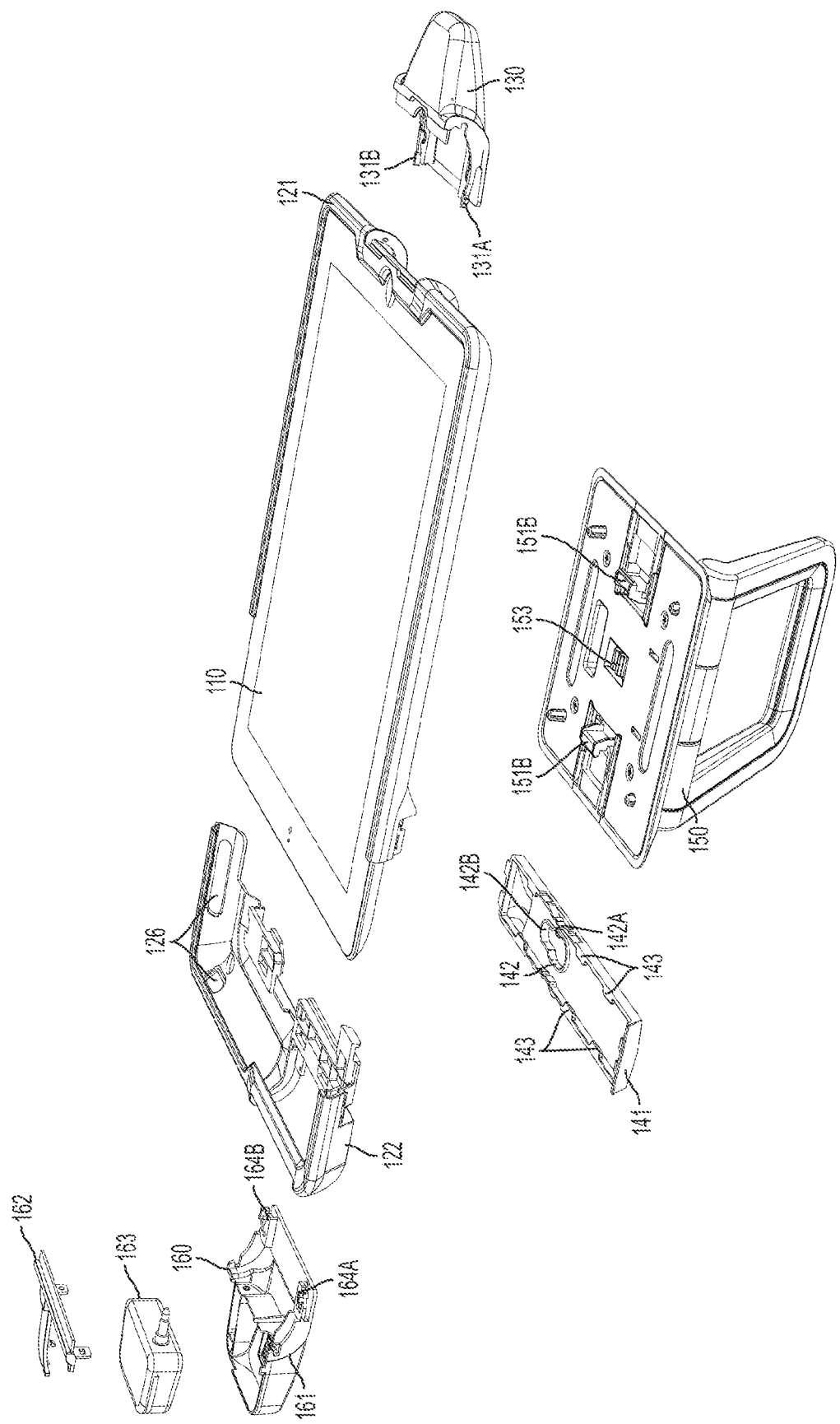
FIG. 1 is an exploded front perspective view of a security apparatus including modular accessories according to an embodiment of the present invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Embodiments of the present invention are directed to security apparatuses for ultra thin portable electronic devices, methods for making and using such security apparatuses, and systems using such security apparatuses. The security apparatuses can be used to prevent or deter the theft of devices such as portable devices, specifically portable electronic devices. Additionally, the security apparatus may engage with a number of various modular accessories such that the security apparatus is easily configurable and customizable.

The security apparatus uses existing security device attachment architecture including, for example, Kensington™ SecureBack™ products and expands these prior systems by adding a modular system that allows accessories to be added to the security apparatus. For example, modular engagement features may be incorporated into the security apparatus adjacent to both the power connector and audio connector of a portable electronic device to allow for connectivity between the modular accessories and the portable electronic device, for example, a tablet computer or device (e.g., an Apple™ iPad™ or Android™ tablet).

Additionally, accessory engagement points may be included on the housing of the security apparatus to secure the portable electronic device and the modular accessories from theft. For example, the modular accessories may be designed to snap into the core case security apparatus in such a way that they cannot be removed once the security apparatus is engaged with a lock. For instance, a snap engagement assembly may be configured to easily couple a modular accessory and a security apparatus together but once engaged, the snap engagement assembly may be configured such that the modular accessory cannot be removed from the security apparatus without disengaging a security bar or otherwise unlocking the security apparatus. Accordingly, the snap engagement assembly may prevent people from tampering with or stealing modular accessories that are connected to the portable electronic device. The snap engagement assemblies may be configured to couple with modular accessories on any portion of the security apparatus including the back, front, bottom, top, or any other suitable location to incorporate an accessory with the security apparatus or portable electronic device. For example, an accessory engagement point on the back surface of the security apparatus may allow the attachment of mechanical accessories such as kickstands, handstraps, wall mounts, etc., and accessory engagement points on the top and bottom of the security apparatus may allow the attachment of electrical accessories such as a card reader modular accessory or power management modular accessory.

Additionally, the rear accessory engagement point may be used to accommodate a back-up battery product. The battery unit may snap onto the back surface and may electrically connect to the portable electronic device via an internally routed cable. The electrical interface between the battery and the encapsulated portable electronic device can be accomplished with a standard cable-to-connector solution (such as USB) or with an intermediate contact charging solution that allows for quick connection and removal.

All of the modular accessories may be designed with lock-out features that prevent them from being removed once the overall enclosure is secured with a lock. This prevents the public from tampering with or removing accessories such as kickstands or back-up battery modules as well as the card reader and power management module.

Accordingly, embodiments of the present invention provide a method for attaching modular accessory components to a protective/secure security apparatus housing for a portable electronic device, for example, a tablet computer. The design uses a method that prevents the modular accessories from being removed once the overall tablet case is secure or locked. Additionally, the modular design of the accessory engagement features of the security apparatus and modular accessories allows various configuration options while using a common security apparatus that protects the portable electronic device. Accordingly, the customer is able to upgrade the accessory modules without having to replace the core protective security apparatus. Additionally, from a manufacturing perspective the modular design allows manufacturers to provide a wide range of solutions that capitalize on a common set of core components or security apparatuses.

Figure 2:
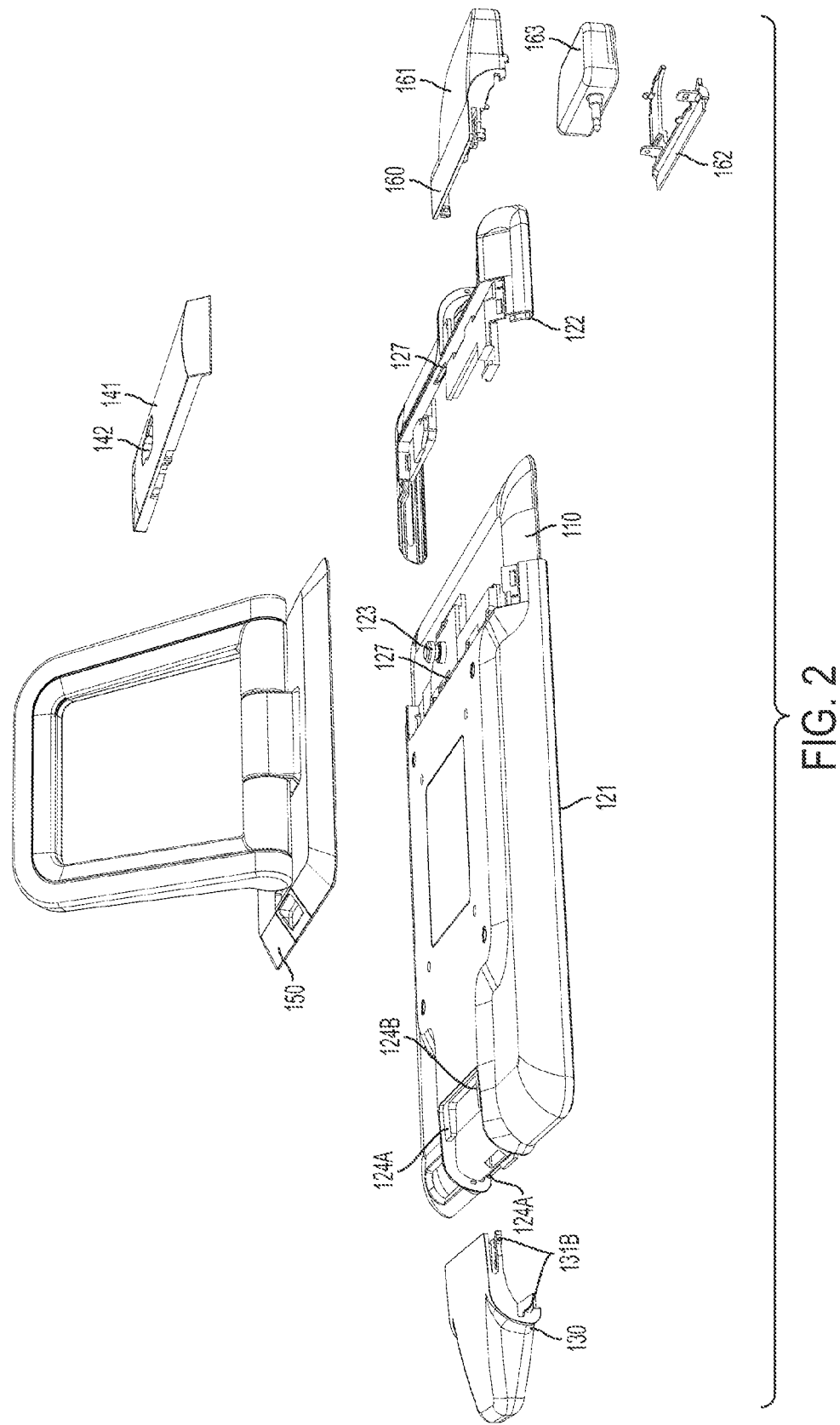
FIG. 2 is an exploded rear perspective view of the security apparatus and modular accessories shown in FIG. 1.

FIGS. 1 and 2 show front and back exploded views of an exemplary embodiment of a security apparatus for securing a portable device 110. The portable device 110 may preferably be a portable electronic device (i.e., portable consumer device). For example, as shown in FIGS. 1 and 2, the portable electronic device may include a tablet computer (e.g., Apple™ iPad™, Android™ tablet, etc.) or other thin, portable devices that do not comprise an attachment device.

The illustrated security apparatus includes a housing comprising a first or bottom housing portion 121 and a second or top housing portion 122. The top housing portion 122 and the bottom housing portion 121 are configured to surround at least a portion (e.g., three sides) of the portable electronic device 110 such that the portable electronic device 110 may not be disengaged or removed from the security apparatus once the apparatus is locked. The bottom housing portion 121 may include an injection molded plastic sleeve or glove which enables a user to slide the portable electronic device 110 into the sleeve or glove in a single motion, thereby securing the lower portion of the portable electronic device 110 beneath the retaining walls of the molded bottom housing portion 121 along three edges; including the left, right, and bottom sides.

As can be seen in FIG. 1, the face or front portion of the portable electronic device 110 is not covered such that a user may interact with the screen or front display of the portable electronic device 110, a keyboard, or other such input devices that may exist.

Once the bottom housing portion 121 is fully engaged with the portable electronic device 110, a top portion of the portable electronic device 110 extends outwardly from the bottom housing portion 121 such that the top housing portion 122 may be engaged with the extended portion of the portable electronic device 110 (and vice versa if the top housing portion 122 is engaged first). The top housing portion 122 and the bottom housing portion 121 are configured such that, when fully engaged with the portable electronic device 110, the top housing portion 122 and the bottom housing portion 121 match the shape and form of the portable electronic device 110. As such, the device 110 cannot be disengaged or removed from the top housing portion 122 or the bottom housing portion 121 without unlocking the security apparatus. Additionally, the top housing portion 122 and the bottom housing portion 121 are configured such that input and output connectors of the portable electronic device 110 are accessible by the user (e.g., through apertures 126 in the top housing portion 122 shown in FIGS. 1 and 2).

As shown in FIG. 2, the illustrated security apparatus also includes an attachment device 123 (e.g., a Kensington™ ClickSafe™ formed mounting spur) coupled to the housing. The attachment device 123 may be made of metal or a similar hard and strong material such that the attachment device 123 is not easily broken, deformed, or separated from the housing. The attachment device 123 may be coupled to the top or bottom housing portions 121, 122 in any suitable manner, including being coupled to the housing when the top housing portion 122 or bottom housing portion 121 is formed.

The illustrated security apparatus also includes a security bar 141. The security bar 141 defines a clearance aperture 142. The security bar 141 is configured to removably couple with the top housing portion 122 and the bottom housing portion 121 when engaged with the housing. The security bar 141 may be configured to engage with the top housing portion 122 and the bottom housing portion 121 through any suitable means, including sliding into position with the top housing portion 122 and the bottom housing portion 121, snapping into position, or any other suitable method of coupling (as explained in further detail below with respect to FIG. 3).

Figure 10:
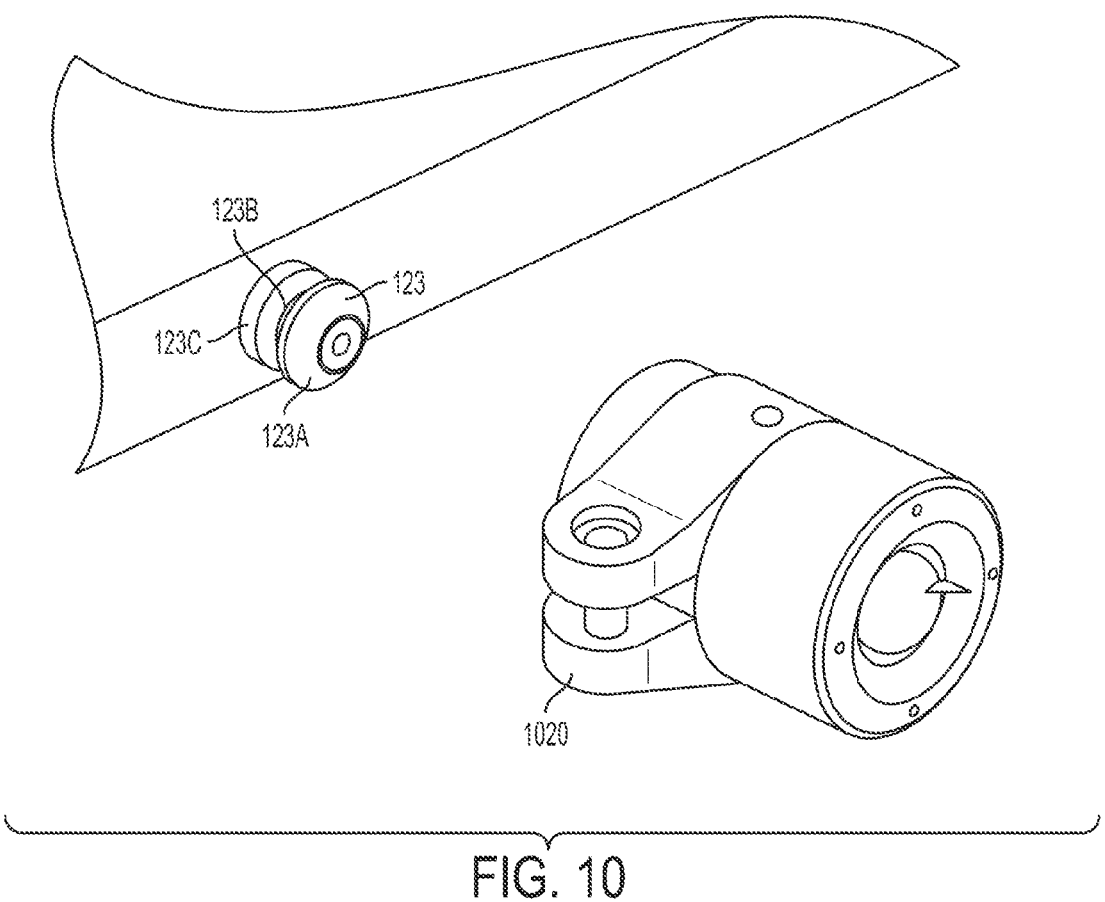
FIG. 10 is a perspective view of an attachment device and a locking head for use with the security apparatus of FIG. 1.

Additionally, the clearance aperture 142 of the security bar 141 is configured to allow the attachment device 123 to extend through the clearance aperture 142 when the security bar 141 is engaged with the housing. Accordingly, as shown in FIG. 1, the clearance aperture 142 has a larger diameter opening 142A on one side in order to allow the attachment device 123 to be engaged with a locking head (as shown in FIG. 10) when the security bar 141 is engaged. In order to ensure the security bar 141 is in the correct position when engaging a locking head, the clearance aperture 142 includes a smaller diameter opening 142B on the opposite end to ensure the locking head would not be able to engage the attachment device 123 as the locking head may be physically blocked by the security bar 141 until the security bar 141 is in the correct engagement location. Accordingly, the smaller diameter opening 142B may be the same diameter of a cap 123A of the attachment device 123 (as shown and discussed in reference to FIG. 10 below) to allow the attachment device 123 to extend through the clearance aperture 142, but not allow enough space for a locking head to couple to the attachment device 123 until the security bar 141 is moved into the correct location.

FIGS. 1 and 2 show exemplary modular accessories for use with the security apparatus. Some examples of modular accessories include a card reader modular accessory or module 160, a power cable modular accessory or module 130, and a kickstand modular accessory or module 150.

As shown in FIGS. 1-2 and 4-5, the illustrated power cable modular accessory 130 includes snap engagement elements 131A, 131B that are configured to couple to snap engagement element receivers 124A, 124B of the bottom housing portion 121. The engagement elements 131A, 131B extend from the power cable modular accessory 130 as cantilevered fingers. The receivers 124A, 124B are recesses formed in the housing that provide engagement points for the engagement elements 131A, 131B. In other embodiments, there may be other suitable configurations of snap engagement elements 131A, 131B and snap engagement element receivers 124A, 124B in order to securely couple a modular accessory to the top housing 122 or the bottom housing 121. The power cable modular accessory 130 shown in FIGS. 1 and 2 includes two sets of snap engagement elements, one set located near the front of the power cable modular accessory 130 and the other set located near the rear of the power cable modular accessory 130 (both identified as 131B). A second set is located on the other side of the power cable modular accessory but cannot be seen in FIG. 1. Additionally, in some embodiments, the snap engagement elements 131A, 131B and the snap engagement element receivers 124A, 124B may be switched such that the snap engagement elements 131A, 131B are located on the housing and the snap engagement element receivers 124A, 124B are located on the power cable modular accessory 130.

Figure 3:
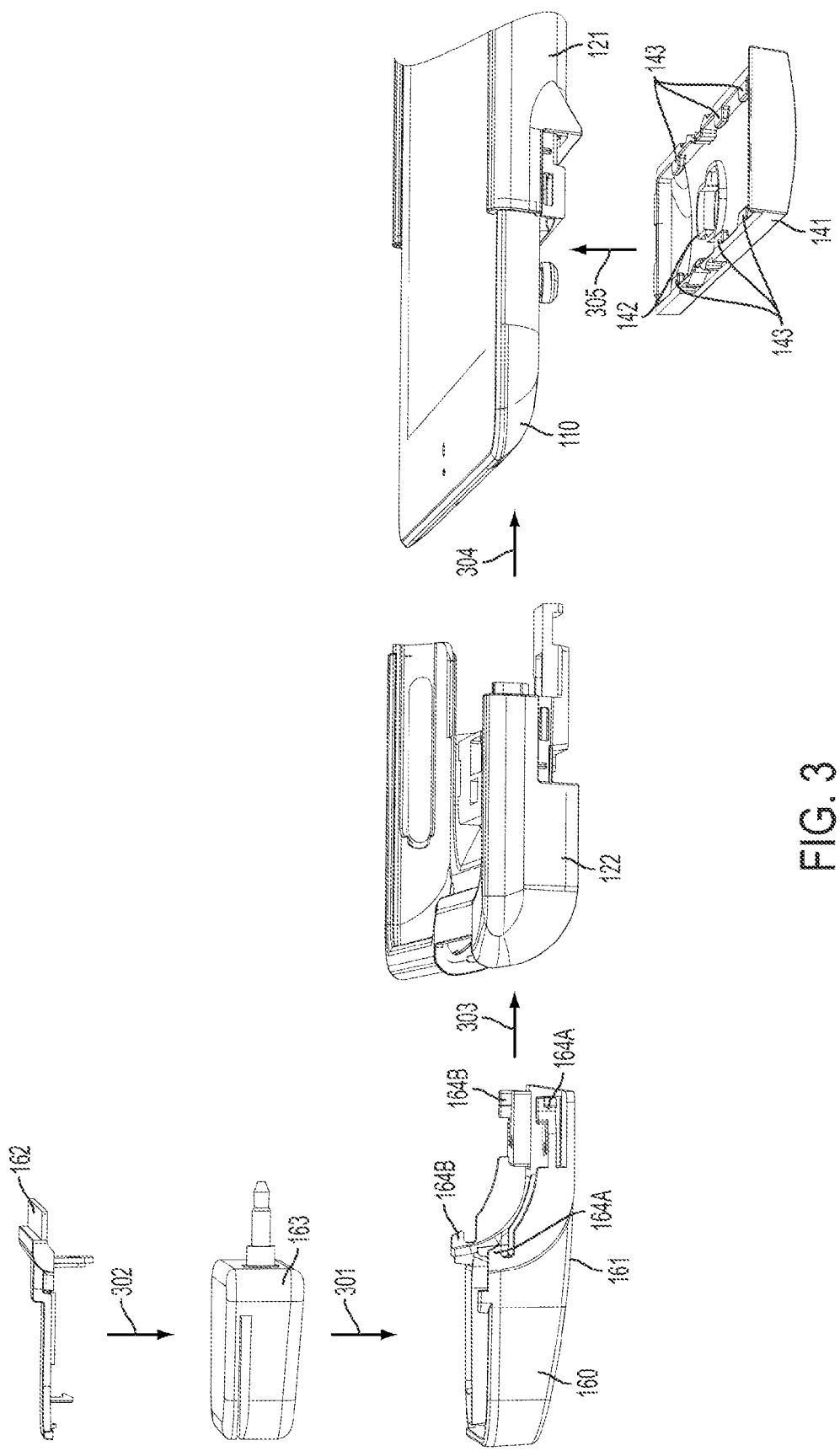
FIG. 3 is an exploded side view of a portion of the security apparatus and one of the modular accessories shown in FIG. 1.

As shown in FIGS. 1-3, the illustrated card reader modular accessory 160 includes a front portion 162, a back portion 161, and a card reader accessory 163 captured between the front and back portions 161, 162. The front portion 162 and the back portion are configured to surround a card reader accessory 163 such that the card reader accessory 163 is securably protected, while still allowing a card to be swiped through the card reader 163 or otherwise engage with the card reader 163. Accordingly, although the front portion 162 and the back portion 162 of the card reader modular accessory 160 surrounds the card reader accessory 163 and securably couples the card reader accessory 163 to the security apparatus, the card reader accessory 163 may be accessible by a user to swipe a card, wave a contactless card, or otherwise interact with the card reader accessory 163.

Similar to the power cable modular accessory 130, the illustrated card reader modular accessory 160 includes snap engagement elements 164A, 164B that extend from the accessory 160. The engagement elements 164A, 164B are configured to engage engagement points on the top housing portion 142 to couple the card reader modular accessory 160 to the housing. The engagement points are recesses formed in the housing, similar to the receivers 124A, 124B discussed above. In some embodiments, the card reader modular accessory 160 may include the snap engagement element receivers, and the top housing portion 122 may comprise the snap engagement elements 164A, 164B.

FIG. 3 shows a front left exploded view of the security apparatus and a method for engaging the card reader modular accessory 160, the top housing portion 122, the bottom housing portion 121, and the security bar 141 to secure a portable device 110.

As shown in FIG. 3, the front portion 162 of the card reader modular accessory 160 may be configured to removably and securably engage with the back portion 161 of the card reader modular accessory 160 to ensure that the card reader accessory 163 is protected and not removable from the card reader modular accessory 160. In some embodiments, the front portion 162 may be configured to also engage with the top housing portion 122 or the bottom housing portion 121 of the security apparatus.

In step 301, the card reader accessory 163 is inserted into a slot in the back portion 161 of the card reader modular accessory 160. The slot holds the card reader accessory 163 in the correct area to ensure that card reader swiping or card reading input may be accessible to a user.

In step 302, the front portion 162 is securably engaged with the back portion 161 through any suitable manner. For example, the front and back portions 162, 161 may comprise elements of a snap engagement assembly such that the portions may easily be engaged, but may be much more difficult to disengage. Once the front portion 162 and the back portion 161 are engaged, the card reader modular accessory 160 is ready to be engaged with the top housing portion 122 of the security apparatus.

In step 303, the card reader modular accessory 160 is coupled to the top housing portion 122 of the security apparatus. As explained previously, the back portion 161 of the card reader modular accessory 160 includes the snap engagement elements 164A, 164B that are configured to engage with snap engagement element receivers (i.e., engagement points) of the top housing portion 122 in order to create a snap engagement assembly. The snap engagement assembly may comprise one or more snap engagement element receivers and one or more snap engagement elements 164A, 164b configured to engage with the snap engagement element receivers. The snap engagement assembly is configured such that the snap engagement element 164A, 164B cannot be removed from the snap engagement element receivers without first disengaging the security bar 141. The security bar 141 needs to be disengaged to allow the removal of the portable device 110 from the housing so a user can access the snap engagement elements 164A, 164B. For example, in order to disengage the illustrated engagement elements 164A, 164B, a user squeezes the elements 164A, 164B together, thereby moving the elements out of engagement with the receivers. The snap engagement elements 164A, 164B are only accessible from inside the housing and are covered by the portable device 110 when the device 110 is engaged by the housing. That is, the engagement elements 164A, 164B are inaccessible when the security apparatus engages the portable device 110 because the device 110 covers the engagement elements 164A, 164B. As such, the user may not be able to put sufficient force on the snap engagement elements without gaining access to the inside of the security apparatus, and the user may not gain access to the inside of the security apparatus unless the security bar 141 is unlocked and disengaged from the housing. Accordingly, in some embodiments, the snap engagement assembly may not be disengaged without unlocking and disengaging the security bar 141.

In step 304, the top housing portion 122 is engaged with the bottom housing portion 121. The bottom housing portion 121 may previously be engaged with the portable electronic device 110 such that the top portion of the electronic device 110 is extending from the bottom housing portion 121. Accordingly, the top housing portion 122 may engage with the top portion of the portable electronic device 110 as the top housing portion 122 is slid toward the bottom housing portion 121. Any suitable method of engaging the top housing portion 122 and the bottom housing portion 121 may be implemented, including an additional snap engagement assembly, guiding elements, or any other suitable method of coupling two housing elements together. When the top housing portion 122 and the bottom housing portion 121 are engaged, at least portions of the portable electronic device 110 (e.g., at least 3 sides) should be snugly surrounded by both the top housing portion 122 and the bottom housing portion 121 such that the top housing portion 122 and the bottom housing portion 121 seem to be a single housing or case for the portable electronic device 110.

In step 305, the security bar 141 is engaged with the top housing portion 122 and the bottom housing portion 121 to secure the portable electronic device 110. For example, the security bar 141 may be rectangular in shape and may be configured to engage with a predetermined slot between the top housing portion 122 and the bottom housing portion 121 by sliding into a predetermined slot created by the coupling of the top housing portion 122 and the bottom housing portion 121. The security bar 141 includes engagement elements 143, guiding elements, latches, or any other physical element to engage with the top housing portion 122 and the bottom housing portion 121. The engagement or guiding elements 143 of the security bar 141 hold the top housing portion 122 and the bottom housing portion 121 together and engage with corresponding guiding elements 127 (FIG. 4), latches, engagement element receivers, or any other suitable physical barrier or element of the top housing portion 122 and the bottom housing portion 123. The guiding elements 127 of the top housing portion 122 and the bottom housing portion 121 physically couple with the engagement or guiding elements 143 of the security bar 141 in order to hold the top housing portion 122 and the bottom housing portion 121 together. The security bar 141 may constrain the movement of the top housing portion 122 and the bottom housing portion 121 such that the top housing portion 122 and the bottom housing portion 121 cannot be pulled apart, separated, or otherwise manipulated when engaged with the security bar 141. Accordingly, the security bar 141 provides the secure connection of the top housing portion 122 and the bottom housing portion 121 and provides the removable and secure coupling that converts the separate housing elements into a secure single housing.

Once the security bar 141 is engaged with the top housing portion 122 and the bottom housing portion 121 and the attachment device 123 is coupled to a locking head (e.g., locking head 1020 shown in FIG. 10), the security apparatus may be considered locked. Additionally, in some embodiments, the security bar 141 itself may comprise a locking apparatus or other locking mechanism and may be considered locked before the security apparatus is coupled to a locking head through the attachment device. Additionally, the security apparatus may also be considered locked when the security bar 141 is in the correct place and the various components cannot easily be removed without first disengaging the security bar 141, then separating the top housing portion 122 and the bottom housing portion 121, etc.

Figure 4:
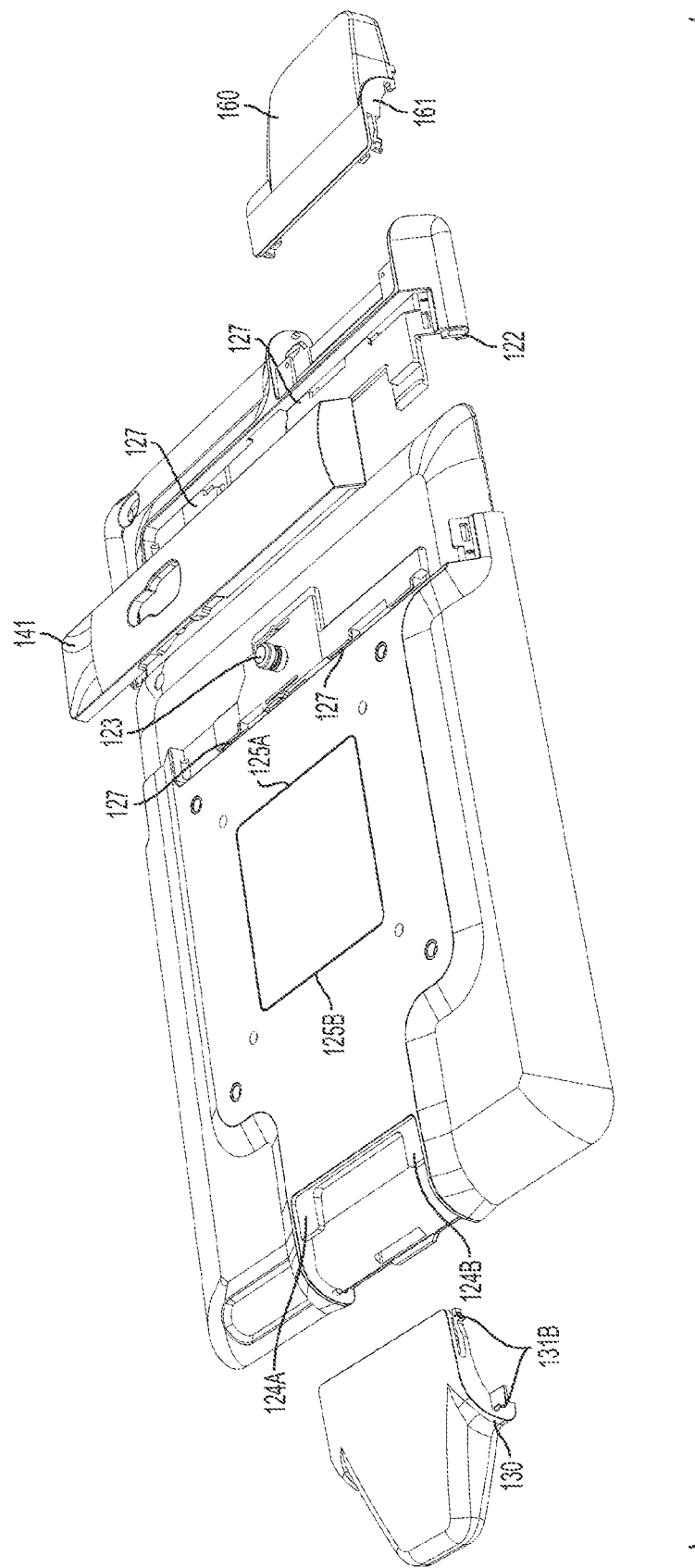
FIG. 4 is another exploded rear perspective view of the security apparatus and modular accessories shown in FIG. 1.

FIG. 4 shows another rear exploded view of the security apparatus including the top housing portion 122, the bottom housing portion 121 engaged with a portable device, the security bar 141, and exemplary modular accessories.

Figure 5:
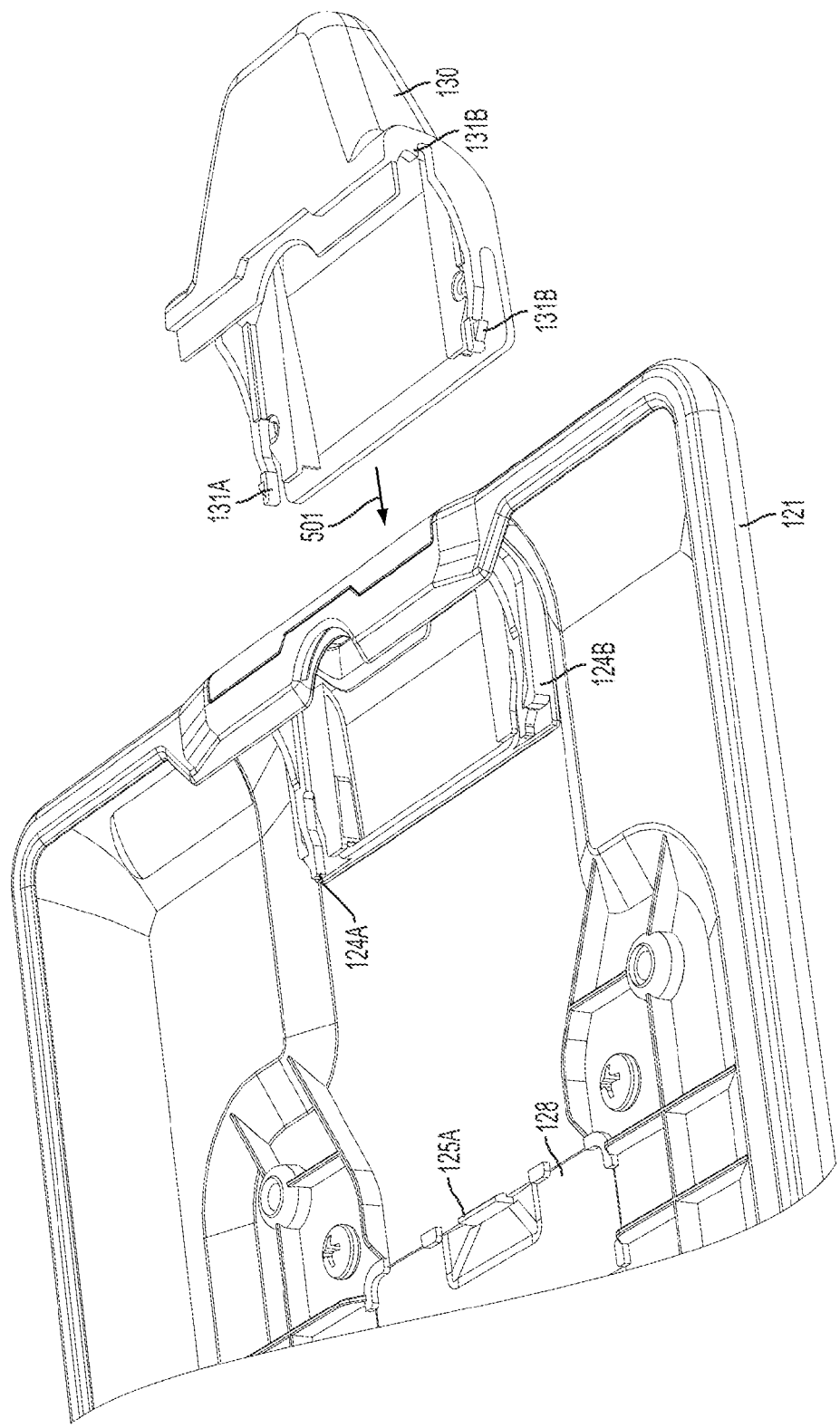
FIG. 5 is an exploded front perspective view of a portion of the security apparatus and one of the modular accessories shown in FIG. 1.

FIG. 5 shows a front exploded view of the security apparatus including the power cable modular accessory 130 engaging with the bottom housing portion 121 using the snap engagement assembly. As explained previously, the snap engagement assembly includes snap engagement elements 131A, 131B and snap engagement element receivers 124A, 124B. Although it is only possible to see one set of snap engagement element receivers 124A, 124B for each side of the bottom housing portion 121, it should be noted that a second set of snap engagement element receivers may be located near the front most portion of the bottom housing 121.

These snap engagement element receivers may engage with the front most snap engagement elements 131A, 131B of the power cable modular accessory 130. Step 501 shows how the power cable modular accessory 130 may be engaged with the bottom housing portion 121 in order to snap the power cable modular accessory 130 into the bottom housing portion 121 using the snap engagement assembly described above. Attaching and detaching the power cable modular accessory 130 to the bottom housing portion 121 is similar to attaching and detaching the card reader modular accessory 160 to the top housing portion 122.

Additionally, the bottom housing portion 121 shown in FIG. 5 is not engaged with a portable electronic device and as such, an accessory engagement area 128 located on the rear of the bottom housing portion 121 is shown. The rear modular accessory engagement area 128 is configured to engage with a hook engagement assembly of a modular accessory. For example, FIG. 5 shows a hook engagement element receiver 125A that is configured to engage with a hook engagement element of a modular accessory.

Figure 6:
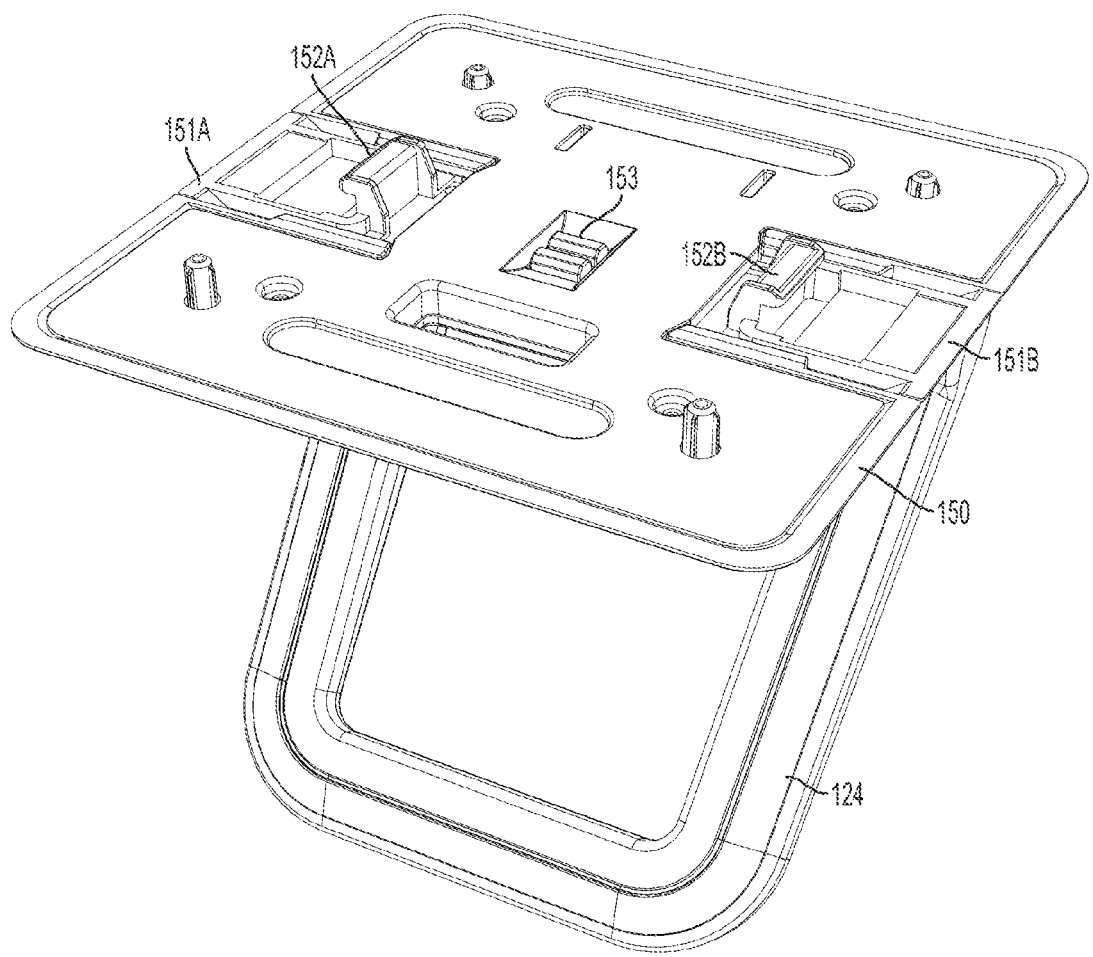
FIG. 6 is a bottom perspective view of a kickstand modular accessory for use with the security apparatus of FIG. 1.

FIG. 6 shows a rear perspective view of the kickstand modular accessory 150. The kickstand modular accessory 150 includes hook elements 152A, 152B of a hook engagement assembly. The hook elements 152A, 152B of the kickstand modular accessory 150 are coupled to release latches 151A, 151B that may be pressured by a user to move the hook elements 152A, 152B inward to clear the hook engagement element receivers 125A, 125B of the bottom housing portion 121. Accordingly, the release latches 151A, 151B are configured to allow disengagement of the hook engagement assembly by moving the hook elements 152A, 152B inwards to clear the hook engagement element receivers 125A, 125B of the bottom housing portion 121.

Additionally, the kickstand modular accessory 150 includes a lock-out assembly 153. The lock-out assembly 153 may be activated to prevent the external release latches 151A, 151B from moving, thus locking the hook elements 152A, 152B in place, and thus the modular accessory in place, until the lock-out assembly 153 is deactivated. Thus, the lock-out assembly helps to prevent tampering with or removing the kickstand modular accessory 150 (or other modular accessories). The lock-out assembly 153 may be activated from inside the housing once engaged with the bottom housing portion 121, but before the bottom housing portion 121 is engaged with a portable electronic device. Thus, the hook elements 152A, 152B are locked in place while engaged with the hook engagement element receivers 125A, 125B of the bottom housing portion 121. Accordingly, in some embodiments, once the portable electronic device 110 is engaged with the bottom housing portion 121, the lock-out assembly 153 may not be deactivated until the portable electronic device 110 is removed from the bottom housing portion 121. That is, the lock-out assembly 153 is inaccessible when the housing engages the portable device 110 because the device 110 covers the lock-out assembly 153. Accordingly, the modular accessory 150 is securably coupled to the security apparatus until the security bar 141 is removed, the top housing portion 122 and bottom housing portion 121 are disengaged, and the portable electronic device 110 is removed. Therefore, the modular accessory 150 is secured and protected from people tampering or attempting to steal the modular accessory 150 while the security apparatus is in the public. Accordingly, the lock-out assembly 153 may lock the hook elements 152A, 152B such that the hook elements 152A, 152B cannot be removed from the hook engagement element receivers 125A, 125B without disengaging the security bar 141 and subsequently the top housing portion 122 and the bottom housing portion 121.

Figure 7:
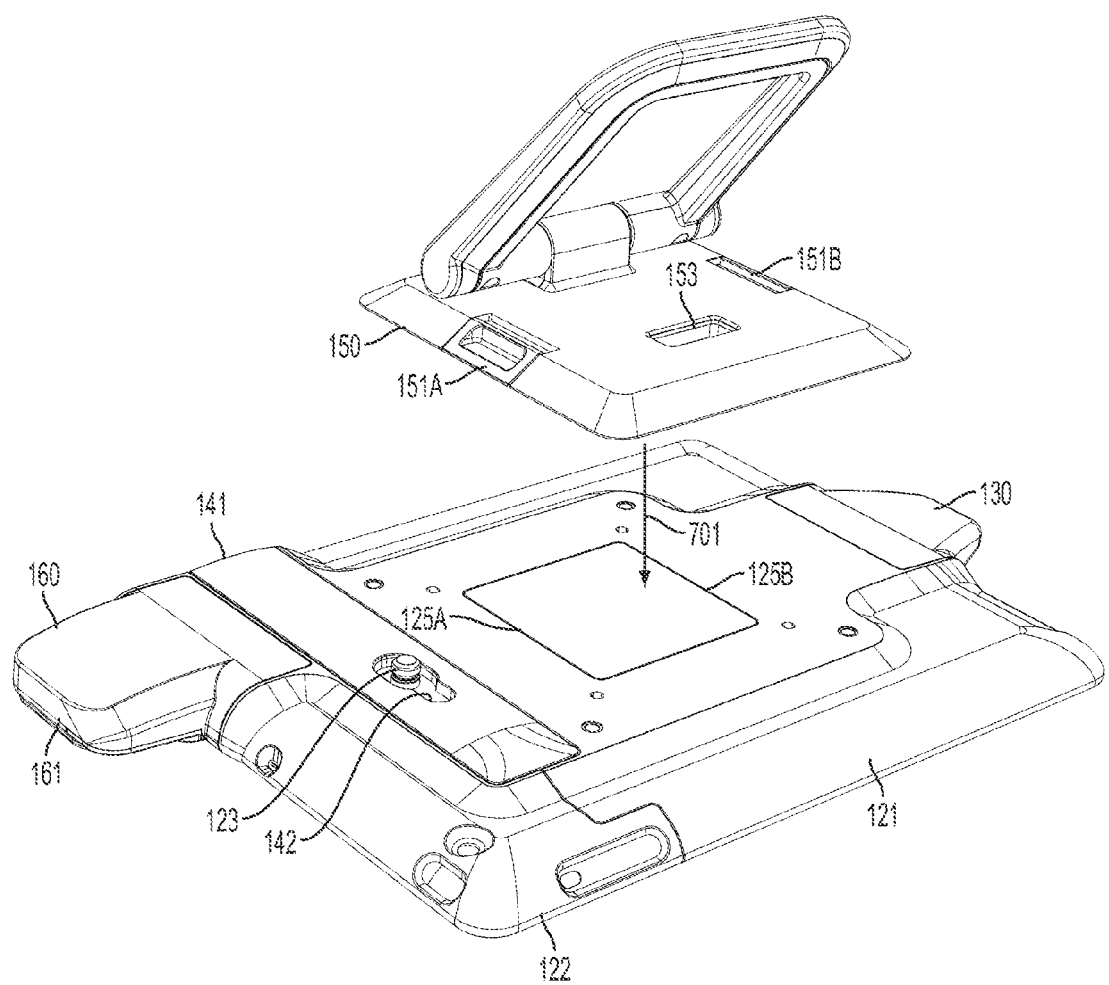
FIG. 7 is an exploded rear perspective view of the security apparatus of FIG. 1 engaging with the kickstand modular accessory of FIG. 6.

FIG. 7 shows a rear exploded view of the security apparatus including the kickstand modular accessory 150. The security apparatus includes the bottom housing portion 121 engaged with a portable device and the top housing portion 122, the top housing portion 122 engaged with the bottom housing 121 and the portable device, the security bar 141 engaged with the top housing portion 122 and the bottom housing portion 121, the attachment device 123 extending through the clearance aperture 142 of the security bar 141, the card reader modular accessory 160 engaged with the top housing portion 122, the power cable management modular accessory 130 engaged with the bottom housing portion 121, and the kickstand modular accessory 150.

Step 701 of FIG. 7 shows how the kickstand modular accessory 150 is engaged with the bottom housing portion 121 of the security apparatus using the hook engagement assembly described above. The kickstand modular assembly 150 may spring into the rear modular accessory engagement area 128 in the bottom housing portion 121. The spring-loaded hook elements 152A, 152B may retract as the modular accessory 150 is pushed inward and pressure is applied to the hook elements 152A, 152B by the outside of the bottom housing portion 121. The hook elements 152A, 152B may then spring outward and engage with the underside (i.e., hook engagement element receivers 125A, 125B, which form engagement points) of the bottom housing portion 121. Additionally, to remove the kickstand modular accessory 150, the release latches 151A, 151B on the outside surface of the kickstand modular accessory 150 are pressed to disengage the hook elements 152A, 152B.

Figure 8:
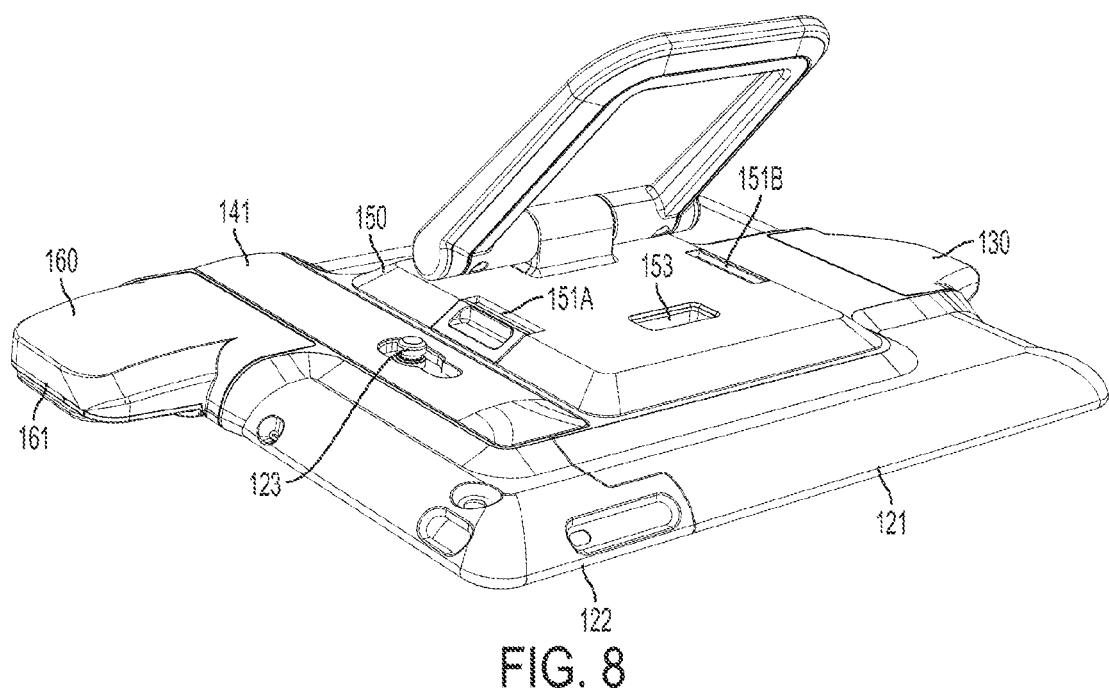
FIG. 8 is a rear perspective view of the security apparatus of FIG. 1 engaged with the kickstand modular accessory of FIG. 6.

FIG. 8 shows the security apparatus fully engaged with multiple modular accessories 130, 150, 160.

Figure 9:
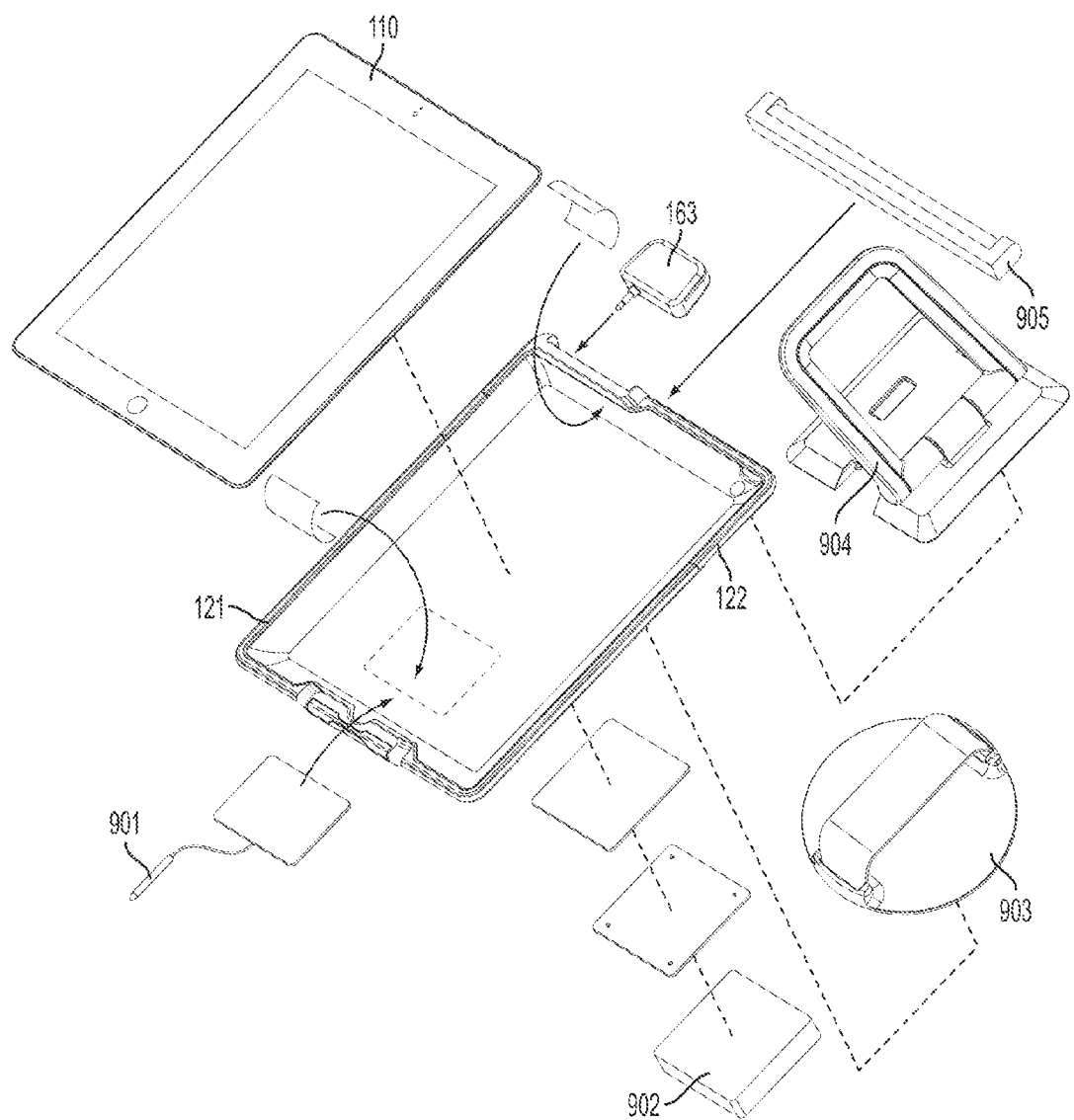
FIG. 9 is an exploded perspective view of the security apparatus of FIG. 1 engaging with other modular accessories.

FIG. 9 shows additional exemplary modular accessories that can be attached to the security apparatus. The additional modular accessories may include a stylus 901 that may be coupled to the security apparatus through a tether and anchor, a battery 902 that may be included in a battery modular accessory, a wireframe stand or leg 904 that may be included in a modular accessory, as well as various handles or hand-straps 903, 905. Any other suitable accessories that may be implemented for a user's purpose may also be designed and incorporated into a modular accessory according to embodiments of the present invention.

FIG. 10 shows the attachment device 123 of the security apparatus and a locking head 1020 that can be coupled to the attachment device 123. Although FIG. 10 does not show the security apparatus in detail, the attachment device 123 of FIG. 10 may be coupled to the security apparatus as shown in FIGS. 1-9 and described above. To permit engagement with the locking head 1020, the attachment device 123 includes, e.g., a recess, such as a recess 123B defined by a cap 123A and a ring structure 123C. The illustrated cap 123A and ring structure 123C have similar diameters. In some implementations, the cap 123A and the ring structure 123C may each comprise cylinders with a substantially (axially) tapered end and a substantially flat end opposite the substantially tapered end. In other implementations, one or more ends of the cap 123A or the ring structure 123C may comprise a curved surface or other uneven shape (i.e., not flat). The lateral side wall of each of the ring structure 123C and the cap 123A may be tapered (as in a cone shape) or may comprise a straight wall.

Figure 11A:
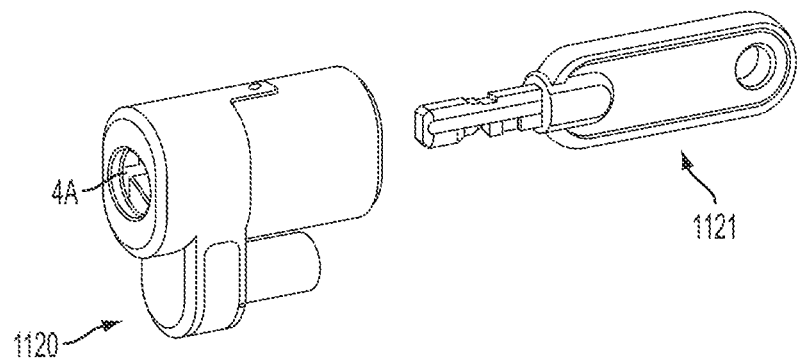
FIG. 11A is an exploded perspective view of the locking head of FIG. 10 with a key.
Figure 11B:
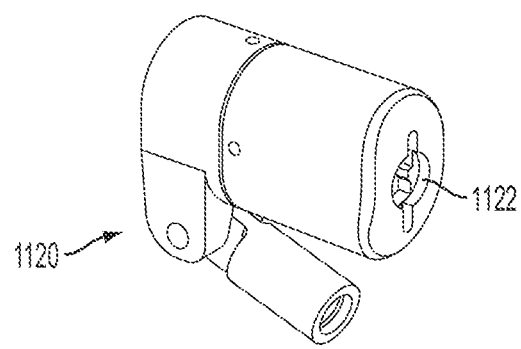
FIG. 11B is a rear perspective view of the locking head of FIG. 10.

FIG. 11A shows an exploded view of the locking head 1220 and a key 1121. A front hole 4a in the locking head 1120 is configured to receive the cap 123A (FIG. 10) of the attachment device 123. The locking head 1120 may include any suitable dimensions, e.g., having a length, height and/or width of about 5-50 mm. FIG. 11B shows a rear perspective view of the locking head 1120. A keyhole 1122 is at a rear section of the locking head 1120. Locking heads and/or keys varying in design and/or operation from that described above may be used, such as those described in U.S. patent application Ser. No. 12/969,401, now U.S. Pat. No. 7,997,106, which is fully incorporated by reference.

Figure 12:
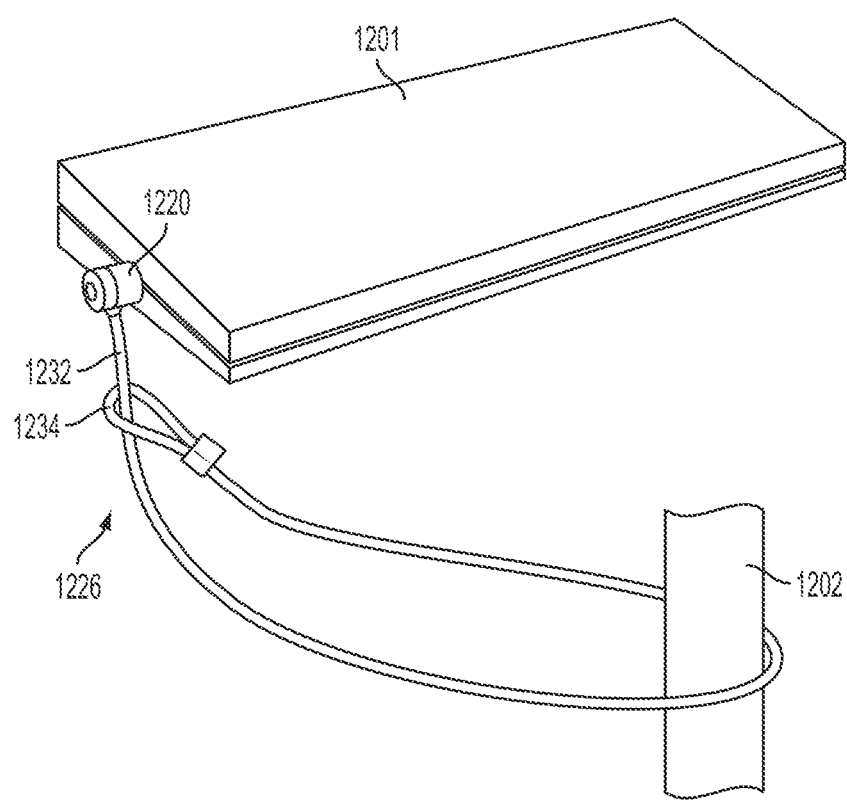
FIG. 12 is a perspective view of a security system for a portable object.

FIG. 12 shows an exemplary security system 1200 comprising a portable object 1201 (i.e., portable device), the locking head 1220, and an immovable object 1202. As shown in FIG. 12, the locking head 1220 is coupled to a cable 1232, which is tethered (by the locking head 1220 passing through an open end of the cable 1234) to a permanent or semi-permanent immovable object 1202. Although FIG. 12 does not show a tablet or security apparatus according to embodiments of the present invention, FIG. 12 shows an example of how a portable object 1201 may be coupled to a locking head 1220 and an immovable object 1202 to secure the portable object 1201. Thus, the engagement of the attachment device and the locking head 1220 may restrain movement of the portable object 1201 by securing the portable object 1201 to the immovable object 1202. The security apparatus of FIGS. 1-9 may be attached to an immovable object 1202 through the locking head 1220 and the attachment device 123 and may secure any portable device 102 in a similar fashion as the portable object 1201 is secured in FIG. 12.

Figure 13:
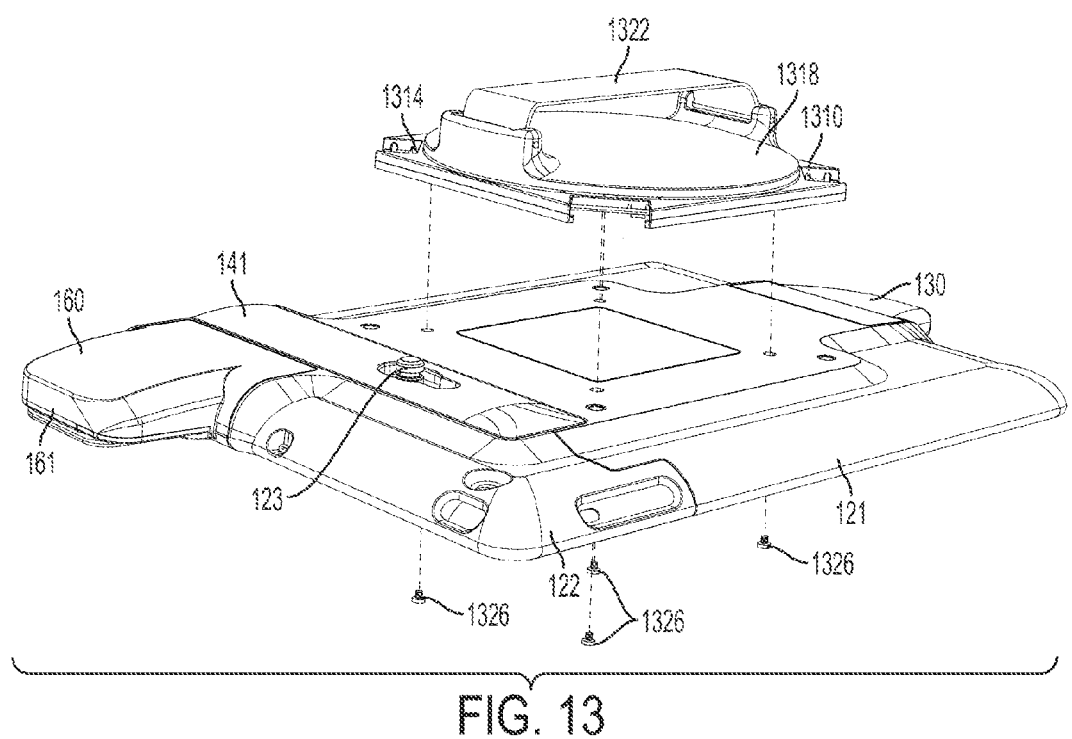
FIG. 13 is an exploded rear perspective view of the security apparatus of FIG. 1 engaging with a handstrap modular accessory.

FIG. 13 shows a rear exploded view of the security apparatus of FIGS. 1-9 including a handstrap modular accessory or module 1310. The handstrap modular accessory 1310 includes a base plate 1314, a grip 1318 rotatably coupled to the base plate 1314, and an elastic strap 1322 coupled to the grip 1318. In the illustrated embodiment, the handstrap modular accessory 1310 is connected to the bottom housing portion 121 by threaded fasteners 1326 (e.g., screws). In particular, the handstrap modular accessory 1310 is secured to the bottom housing portion 121 by threaded fasteners 1326 extending from inside the housing to engage the base plate 1314. As such, the fasteners 1326 cannot be engaged, and thereby tightened or loosened, when the housing is engaged with a portable device. Accordingly, the fasteners 1326 may not be disengaged without disengaging the security bar 141 from the top and bottom housing portions 121, 122.

In other embodiments, the handstrap modular accessory 1310 can be coupled and secured to the bottom housing portion 122 using a hook engagement assembly, similar to the hook engagement assembly of the kickstand modular accessory 150 described above.

Figure 14:
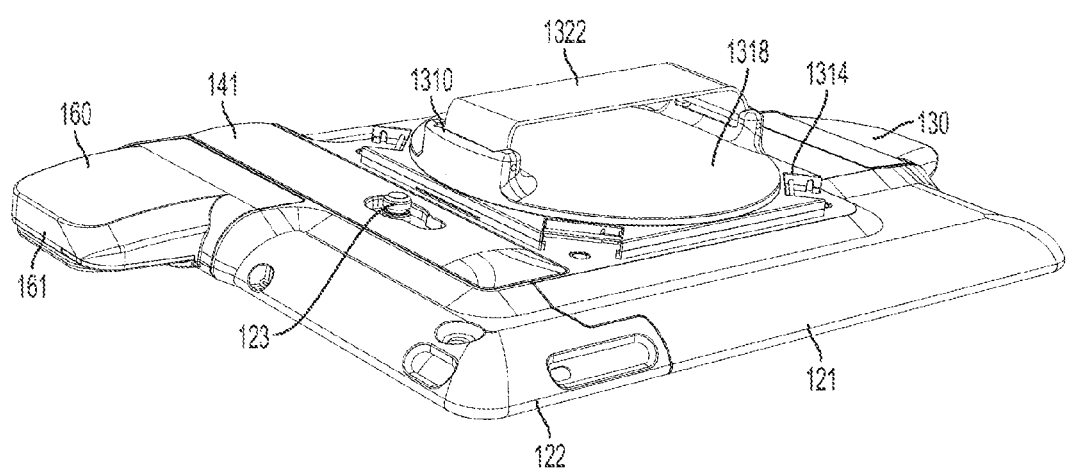
FIG. 14 is a rear perspective view of the security apparatus of FIG. 13 engaged with the handstrap modular accessory of FIG. 13.

FIG. 14 shows the security apparatus fully engaged with the handstrap modular accessory 1310.

Embodiments of the present invention provide a number of advantages, including providing protective case that enables a user to support mobile physical security for an otherwise unsecurable form factor without the use of permanent adhesive additions. Additionally, the customizable modular design supports a wide range of combinations and choices for the best possible fit to a consumer's or user's application or needs. Furthermore, embodiments of the present invention provide a user with means to secure portable electronic devices with a fast and secure cable lock assembly, engaged with a single "click" supporting both key and combination locks. Finally, the minimalist, low profile, and ultra-slim footprint protective case is also a "portable" or readily mobile security case product solution that supports the inherent mobility of the portable electronic device. The security apparatus also provides deterrent security by deterring potential thieves through the secured look and feel of the device. Additionally, the present invention may be used with many different types of locks including Kensington™ ClickSafe™ Combo and Keyed locks.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

One or more features from any embodiment may be combined with one or more features of any other embodiment without departing from the scope of the invention.

A recitation of "a", "an" or "the" is intended to mean "one or more" unless specifically indicated to the contrary.

Various features and advantages of the invention are set forth in the following claims.

What is claimed is:

1. A security apparatus for securing a portable device, the security apparatus comprising:
   a housing including
      a first housing portion configured to partially surround a first portion of the portable device, and
      a second housing portion configured to partially surround a second portion of the portable device, the second housing portion being selectively secured to the first housing portion when the housing is engaged with the portable device;
   an attachment device extending from the housing, the attachment device configured to engage a locking head; and
   a modular accessory coupled to the housing, the modular accessory being connected to the housing when the first and second housing portions are secured together to surround the portable device, and the modular accessory being removable from the housing only when the first and second housing portions are disconnected from the portable electronic device.

2. The security apparatus of claim 1, wherein the modular accessory is secured to the housing by a snap engagement assembly.

3. The security apparatus of claim 2, wherein the snap engagement assembly includes
   a first engagement element extending from one of the housing and the modular accessory, the first engagement element operable to engage a first engagement point on the other of the housing and the modular accessory, and
   a second engagement element extending from the one of the housing and the modular accessory, the second engagement element being spaced apart from the first engagement element and operable to engage a second engagement point on the other of the housing and the modular accessory,
   wherein the first and second engagement elements are squeezable together to disengage the first and second engagement points, and wherein the first and second engagement elements are inaccessible when the first and second housing portions are secured together to surround the portable device.

4. The security apparatus of claim 3, wherein the modular accessory includes a power cable module, and wherein the first and second engagement elements extend from the power cable module and engage the first and second engagement points on the first housing portion.

5. The security apparatus of claim 3, wherein the modular accessory includes a payment device reader module, and wherein the first and second engagement elements extend from the payment device reader module and engage the first and second engagement points on the second housing portion.

6. The security apparatus of claim 1, wherein the modular accessory is secured to the housing by a hook engagement assembly.

7. The security apparatus of claim 6, wherein the hook engagement assembly includes
   a hook element extending from one of the housing and the modular accessory, the hook element operable to engage an engagement point on the other of the housing and the modular accessory,
   a release latch coupled to the hook element, the release latch operable to disengage the hook element from the engagement point, and
   a lock-out assembly operable to selectively inhibit movement of the release latch,
   wherein the lock-out assembly is inaccessible when the first and second housing portions are secured together to surround the portable device.

8. The security apparatus of claim 7, wherein the modular accessory includes a kickstand module, wherein the hook element extends from the kickstand module to engage the engagement point on the first housing portion, and wherein the release latch and the lock-out assembly are supported by the kickstand module.

9. The security apparatus of claim 1, further comprising a security bar defining a clearance aperture, wherein the security bar engages the first housing portion and the second housing portion to secure the first and second housing portions together, and wherein the attachment device extends through the clearance aperture of the security bar.

10. A security apparatus for securing a portable device, the security apparatus comprising:
    a housing including
      a first housing portion configured to partially surround a first portion of the portable device, and
      a second housing portion configured to partially surround a second portion of the portable device, the second housing portion being coupled to the first housing portion when the housing is engaged with the portable device;
    a security bar defining a clearance aperture, the security bar engaging the first housing portion and the second housing portion to secure the first and second housing portions together;
    an attachment device extending from the housing through the clearance aperture of the security bar, the attachment device configured to engage a locking head to inhibit removal of the security bar from the first and second housing portions; and
    a modular accessory coupled to the housing.

11. The security apparatus of claim 10, wherein the modular accessory cannot be removed from the housing without disengaging the security bar from the first and second housing portions.

12. The security apparatus of claim 10, wherein the modular accessory is secured to the housing by a snap engagement assembly, the snap engagement assembly including
    a first engagement element extending from one of the housing and the modular accessory, the first engagement element operable to engage a first engagement point on the other of the housing and the modular accessory, and
    a second engagement element extending from the one of the housing and the modular accessory, the second engagement element being spaced apart from the first engagement element and operable to engage a second engagement point on the other of the housing and the modular accessory,
    wherein the first and second engagement elements are squeezable together to disengage the first and second engagement points, and wherein the first and second engagement elements are inaccessible when the first and second housing portions are secured together to surround the portable device.

13. The security apparatus of claim 12, wherein the modular accessory includes a power cable module, and wherein the first and second engagement elements extend from the power cable module and engage the first and second engagement points on the first housing portion.

14. The security apparatus of claim 12, wherein the modular accessory includes a payment device reader module, and wherein the first and second engagement elements extend from the payment device reader module and engage the first and second engagement points on the second housing portion.

15. The security apparatus of claim 10, wherein the modular accessory is secured to the housing by a hook engagement assembly, the hook engagement assembly including
    a hook element extending from one of the housing and the modular accessory, the hook element operable to engage an engagement point on the other of the housing and the modular accessory,
    a release latch coupled to the hook element, the release latch operable to disengage the hook element from the engagement point, and
    a lock-out assembly operable to selectively inhibit movement of the release latch,
    wherein the lock-out assembly is inaccessible when the first and second housing portions are secured together to surround the portable device.

16. The security apparatus of claim 15, wherein the modular accessory includes a kickstand module, wherein the hook element extends from the kickstand module to engage the engagement point on the first housing portion, and wherein the release latch and the lock-out assembly are supported by the kickstand module.

17. The security apparatus of claim 10, wherein the modular accessory includes a handstrap module.

18. A security system comprising:
    a portable device;
    a security apparatus including
      a housing having a first housing portion partially surrounding a first portion of the portable device, and a second housing portion partially surrounding a second portion of the portable device, the second housing portion being coupled to the first housing portion so that the housing engages the portable device,
      a security bar defining a clearance aperture, the security bar engaging the first housing portion and the second housing portion to secure the first and second housing portions together,
      an attachment device extending from the housing through the clearance aperture of the security bar, and
      a modular accessory coupled to the housing, wherein the modular accessory cannot be removed from the housing without disengaging the security bar from the first and second housing portions; and
    a locking head secured to the attachment device to inhibit removal of the security bar from the first and second housing portions, the locking head configured to be secured to an immovable object.

19. The security system of claim 18, wherein the modular accessory includes one of a power cable module, a payment device reader module, a kickstand module, and a handstrap module.

20. The security system of claim 18, wherein the portable device is a tablet computer.

* * * * *